US012588481B2

(12) United States Patent
Zhu

(10) Patent No.: US 12,588,481 B2
(45) Date of Patent: Mar. 24, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventor: Mengkai Zhu, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 382 days.

(21) Appl. No.: 17/874,303

(22) Filed: Jul. 27, 2022

(65) Prior Publication Data

US 2022/0367271 A1 Nov. 17, 2022

Related U.S. Application Data

(63) Continuation of application No. 16/403,596, filed on May 5, 2019, now Pat. No. 11,437,272.

(30) Foreign Application Priority Data

Apr. 10, 2019 (CN) .......................... 201910284956.1

(51) Int. Cl.
*H10D 30/67* (2025.01)
*H01L 21/762* (2006.01)
*H01L 21/768* (2006.01)
*H10D 86/00* (2025.01)

(52) U.S. Cl.
CPC .... *H01L 21/76897* (2013.01); *H01L 21/7624* (2013.01); *H01L 21/76832* (2013.01); *H01L*

*21/76895* (2013.01); *H10D 30/6758* (2025.01); *H10D 86/201* (2025.01)

(58) Field of Classification Search
CPC ............ H10D 86/201; H01L 21/76897; H01L 21/7624; H01L 21/76832; H01L 21/76895; H01L 27/1203; H01L 29/78603
See application file for complete search history.

(56) References Cited

U.S. PATENT DOCUMENTS

| | | | |
|---|---|---|---|
| 5,384,281 A | 1/1995 | Kenney | |
| 6,162,686 A | 12/2000 | Huang | |
| 6,211,035 B1 | 4/2001 | Moise et al. | |
| 8,911,558 B2 | 12/2014 | Li et al. | |
| 9,305,877 B1 | 4/2016 | Yu | |
| 9,887,159 B1 | 2/2018 | Zhu | |
| 2004/0150012 A1 | 8/2004 | Jin | |
| 2005/0221601 A1 | 10/2005 | Kawano | |
| 2008/0020488 A1 | 1/2008 | Clevenger | |

(Continued)

FOREIGN PATENT DOCUMENTS

| | | |
|---|---|---|
| CN | 101794717 A | 8/2010 |
| CN | 103515296 A | 1/2014 |

(Continued)

*Primary Examiner* — Nathan W Ha

(74) *Attorney, Agent, or Firm* — Winston Hsu

(57) ABSTRACT

A semiconductor device includes: a substrate having a first semiconductor layer, an insulating layer, and a second semiconductor layer; an active device on the substrate; an interlayer dielectric (ILD) layer on the active device; a first contact plug in the ILD layer and electrically connected to the active device; and a second contact plug in the ILD layer and the insulating layer, wherein a top surface of the second contact plug is higher than a top surface of the ILD layer.

10 Claims, 6 Drawing Sheets

(56)                References Cited

U.S. PATENT DOCUMENTS

2008/0081478  A1      4/2008  Huang
2009/0001466  A1      1/2009  Yang
2011/0006428  A1      1/2011  Lo
2011/0089572  A1      4/2011  Tezcan
2013/0020468  A1      1/2013  Mitsuhashi
2014/0070426  A1      3/2014  Park
2015/0183081  A1      7/2015  Deng
2017/0186668  A1      6/2017  Wu
2020/0328116  A1 *   10/2020  Zhu ................... H01L 21/76832

FOREIGN PATENT DOCUMENTS

CN          108231670  A      6/2018
JP            5-291408  A     11/1993
KR       1997-0052381  A      7/1997
KR        10-0755141  B1      9/2007

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 16/403,596, filed on May 5, 2019. The content of the application is incorporated herein by reference.

BACKGROUND OF THE INVENTION

1. Field of the Invention

The invention relates to a method for fabricating semiconductor device, and more particularly, to a method of forming contact plug penetrating through a silicon-on-insulator (SOI) substrate and contact plug penetrating interlayer dielectric (ILD) layer to connect to an active device.

2. Description of the Prior Art

In the manufacturing of semiconductors devices, SOI wafers or substrates are used to provide superior isolation between adjacent devices in an integrated circuit as compared to devices built into bulk wafers. SOI substrates are silicon wafers with a thin layer of oxide or other insulators buried in it. Devices are built into a thin layer of silicon on top of the buried oxide. The superior isolation thus achieved may eliminate the "latch-up" in CMOS devices and further reduces parasitic capacitances.

Current fabrication process for fabricating active device such as metal-oxide semiconductor (MOS) transistors on a SOI substrate typically involves the formation of at least two different sizes of contact plugs, including a contact plug connected to the active device and a backside contact plug penetrating the SOI substrate and connecting to another silicon wafer. However, current fabrication for these two types of contact plugs still poses numerous drawbacks. Hence, how to provide a simple as well as cost effective way for fabricating a device containing these elements has become an important task in this field.

SUMMARY OF THE INVENTION

According to an embodiment of the present invention, a semiconductor device includes: a substrate having a first semiconductor layer, an insulating layer, and a second semiconductor layer; an active device on the substrate; an interlayer dielectric (ILD) layer on the active device; a first contact plug in the ILD layer and electrically connected to the active device; and a second contact plug in the ILD layer and the insulating layer, wherein a top surface of the second contact plug is higher than a top surface of the ILD layer.

According to another aspect of the present invention, a semiconductor device includes: a substrate having a first semiconductor layer, an insulating layer, and a second semiconductor layer; an active device on the substrate; an interlayer dielectric (ILD) layer on the active device; a first contact plug in the ILD layer and electrically connected to the active device wherein a top surface of the first contact plug is higher than a top surface of the ILD layer; and a second contact plug in the ILD layer and the insulating layer, wherein a top surface of the second contact plug is higher than a top surface of the ILD layer and the top surface of the first contact plug.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
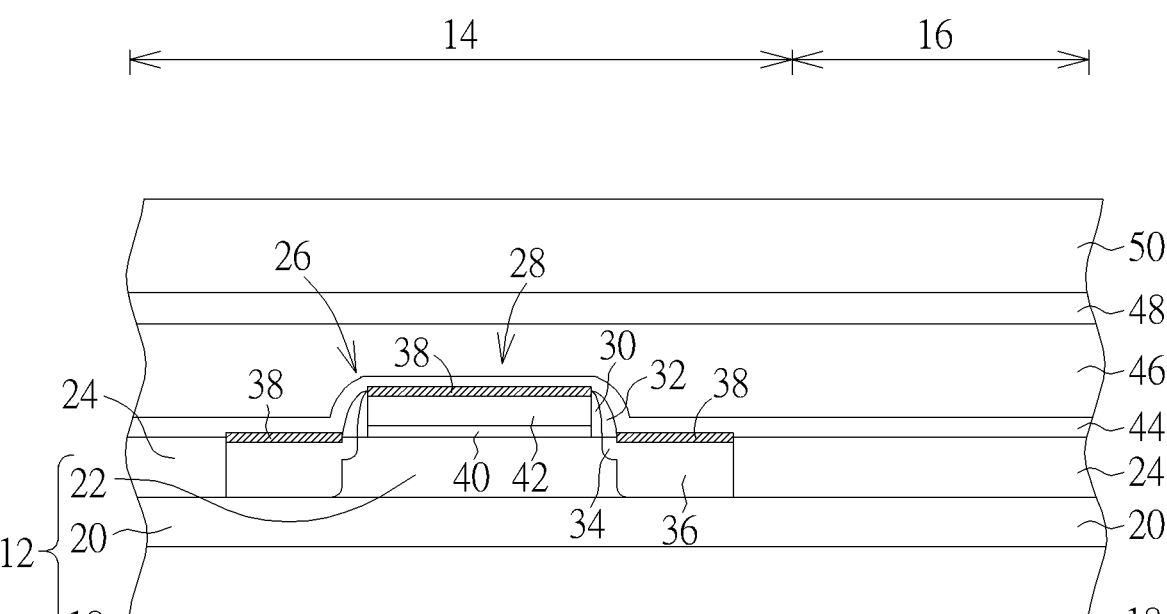
FIG. 1 illustrates a method for fabricating a semiconductor device according to a preferred embodiment of the present invention.

Referring to FIGS. 1-8, FIGS. 1-8 illustrate a method for fabricating a semiconductor device according to a preferred embodiment of the present invention. As shown in FIG. 1, a substrate 12 is provided and a first region 14 and a second region 16 are defined on the substrate 12, in which the first region 14 is preferably used for fabricating active device such as metal-oxide semiconductor (MOS) transistors and the second region 16 is used for fabricating backside contact plug penetrating the entire substrate 12 and connecting to another substrate or semiconductor wafer.

In this embodiment, the substrate 12 is preferably a silicon-on-insulator (SOI) substrate, which preferably includes a first semiconductor layer 18, an insulating layer 20 on the first semiconductor layer 18, and a second semiconductor layer 22 on the insulating layer 20. Preferably, the first semiconductor layer 18 and the second semiconductor layer 22 could be made of same material or different material and could both be made of material including but not limited to for example silicon, germanium, or silicon germanium (SiGe). The insulating layer 20 disposed between the first semiconductor layer 18 and second semiconductor layer 22 preferably includes $SiO_2$, but not limited thereto. It should be noted that even though a SOI substrate is chosen as the substrate for the semiconductor device of this embodiment, the substrate 12 could also be made of semiconductor substrate material including but not limited to for example silicon substrate, epitaxial silicon substrate, or silicon carbide substrate, which are all within the scope of the present invention.

Next, as part of the second semiconductor layer 22 could be removed to form a shallow trench isolation (STI) 24 around the second semiconductor layer 22, which an active device is preferably formed on the second semiconductor layer 22 surrounded by the STI 24.

Next, an active device 26 is formed on the substrate 12. In this embodiment, the active device 26 is preferably a MOS transistor, which preferably includes a gate structure 28, a spacer 30 and spacer 32 on the sidewalls of the gate structure 28, a lightly doped drain 34 in the second semiconductor layer 22 adjacent to two sides of the spacer 30, a source/drain region 36 in the second semiconductor layer 22 adjacent to two sides of the spacer 32, a selective epitaxial layer (not shown) in the second semiconductor layer 22 adjacent to two sides of the spacer 32, and a selective silicide 38 on the surface of the source/drain region 36 and the top of the gate structure 28.

In this embodiment, the gate structure 28 further includes a gate dielectric layer 40 and a gate material layer 42 or gate electrode on the gate dielectric layer 40, in which the gate dielectric layer 40 could include $SiO_2$, silicon nitride, or high-k dielectric layer and the gate material layer 24 could include metal, polysilicon, or silicides.

Each of the spacer 30 and spacer 32 could be a single spacer made of material including but not limited to for example $SiO_2$, SiN, SiON, SiCN, or combination thereof. Nevertheless, according to an embodiment of the present invention, each of the spacers 30 and 32 could also be a composite spacer including a first sub-spacer (not shown) and a second sub-spacer (not shown), in which one of the first sub-spacer and the second sub-spacer could be L-shaped or I-shaped, the first sub-spacer and the second sub-spacer could be made of same material or different material, and both the first sub-spacer and the second sub-spacer could be made of material including but not limited to for example $SiO_2$, SiN, SiON, SiCN, or combination thereof, which are all within the scope of the present invention.

Next, a contact etch stop layer (CESL) 44 preferably made of silicon nitride is formed on the substrate 12 to cover the gate structure 28 and an ILD layer 46 is formed on the CESL 44. Next, a pad layer 48 and a mask layer 50 are formed on the ILD layer 46, in which the pad layer 48 preferably includes $SiO_2$ and the mask layer 50 preferably includes a composite structure including an amorphous carbon film (APF) and a dielectric antireflective coating (DARC).

Figure 2:
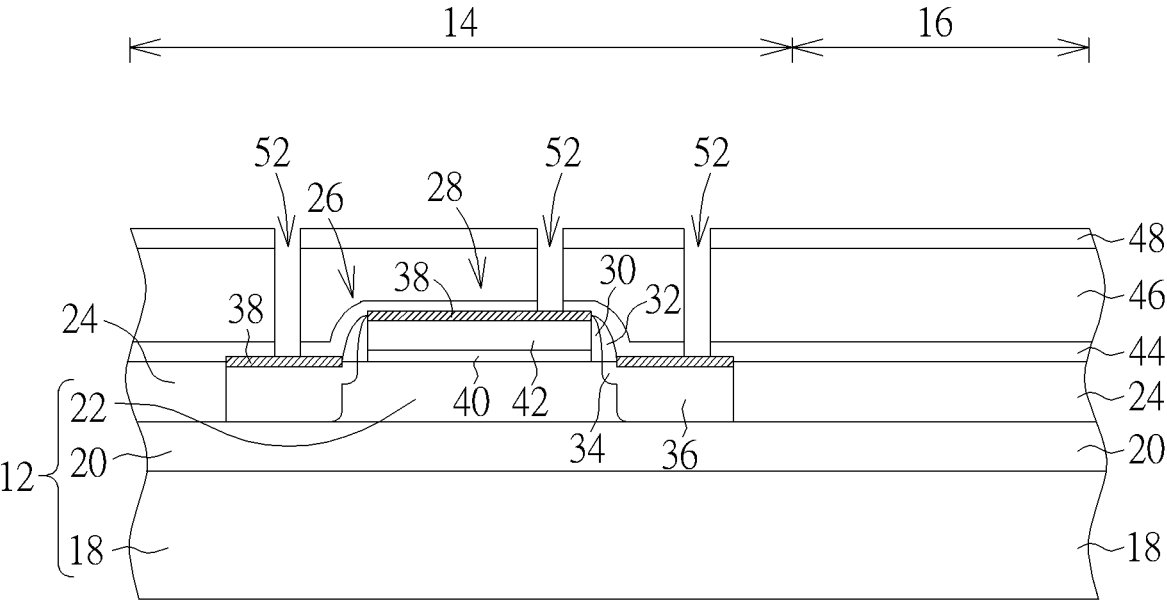
FIG. 2 illustrates a method for fabricating a semiconductor device according to a preferred embodiment of the present invention following FIG. 1.

Next, as shown in FIG. 2, a patterned resist (not shown) could be formed on the surface of the mask layer 50, and an etching process is conducted by using the patterned resist as mask to remove part of the mask layer 50, part of the pad layer 48, part of the ILD layer 46, and part of the CESL 44 to form a plurality of first contact holes 52 in the ILD layer 46 and CESL 44 on the first region 14 exposing the gate structure 28 and source/drain region 36 of the active device 26. The mask layer 50 is then removed to expose the surface of the pad layer 48. It should be noted that when the etching process is conducted to remove the mask layer 50 part of the pad layer 48 could also be removed at the same time so that the thickness of the remaining pad layer 48 at this stage is slightly less than the thickness of the pad layer 48 in FIG. 1.

Figure 3:
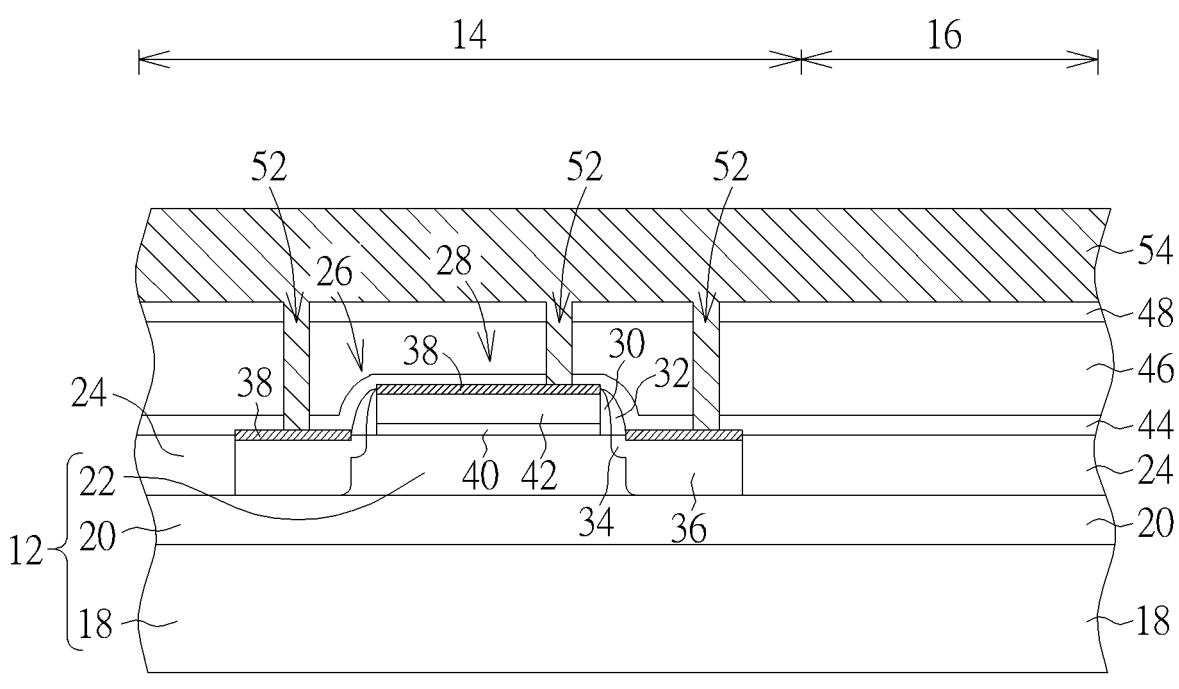
FIG. 3 illustrates a method for fabricating a semiconductor device according to a preferred embodiment of the present invention following FIG. 2.

Next, as shown in FIG. 3, a contact plug formation is conducted by forming a conductive layer 54 in the first contact holes 52, in which the conductive layer 54 could further include a barrier layer (not shown) and a metal layer (not shown). In this embodiment, the barrier layer could be selected from the group consisting of Ti, Ta, TiN, TaN, and WN and the metal layer could be selected from the group consisting of Al, Ti, Ta, W, Nb, Mo, and Cu.

Figure 4:
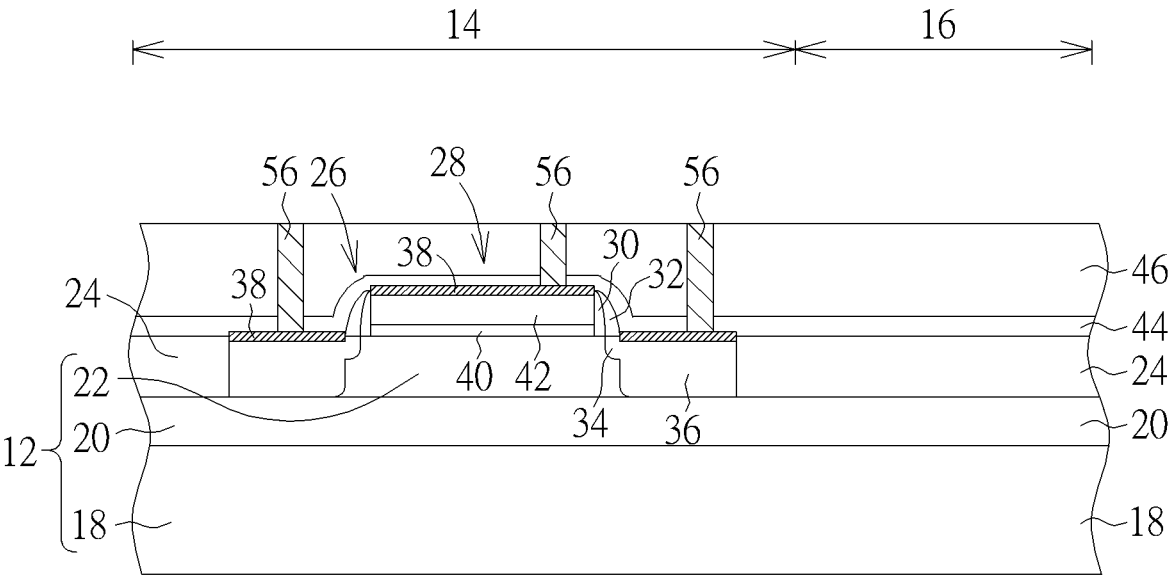
FIG. 4 illustrates a method for fabricating a semiconductor device according to a preferred embodiment of the present invention following FIG. 3.

Next, as shown in FIG. 4, a planarizing process such as chemical mechanical polishing (CMP) process is conducted to remove part of the metal layer, part of the barrier layer, and the pad layer 48 to form a plurality of first contact plugs 56 in the ILD layer 46 on the first region 14 to electrically connect the gate structure 28 and the source/drain region 36, in which the top surfaces of the first contact plugs 56 and the ILD layer 46 are coplanar.

Figure 5:
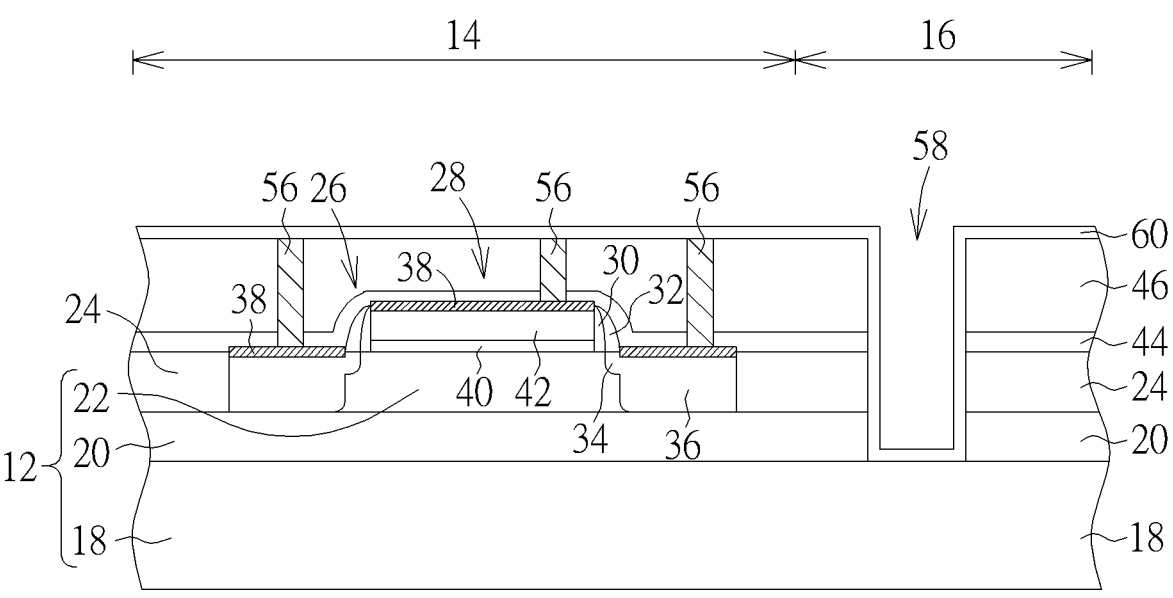
FIG. 5 illustrates a method for fabricating a semiconductor device according to a preferred embodiment of the present invention following FIG. 4.

Next, as shown in FIG. 5, another photo-etching process is conducted by first forming another patterned resist (not shown) on the ILD layer 46, in which the patterned resist includes an opening (not shown) exposing the part of the top surface of the ILD layer 46 on the second region 16. Next, the patterned resist is used as mask to remove part of the ILD layer 46, part of the CESL 44, part of the STI 24, and part of the insulating layer 20 to form a second contact hole 58. Next, a high-density plasma (HDP) process is conducted to form a liner 60 on the surface of the ILD layer 46 and into the second contact hole 58. Preferably, the liner 60 is formed to cover the sidewalls and bottom surface of the second contact hole 58 without filling the second contact hole 58 completely, in which the liner 60 is preferably made of $SiO_2$.

Figure 6:
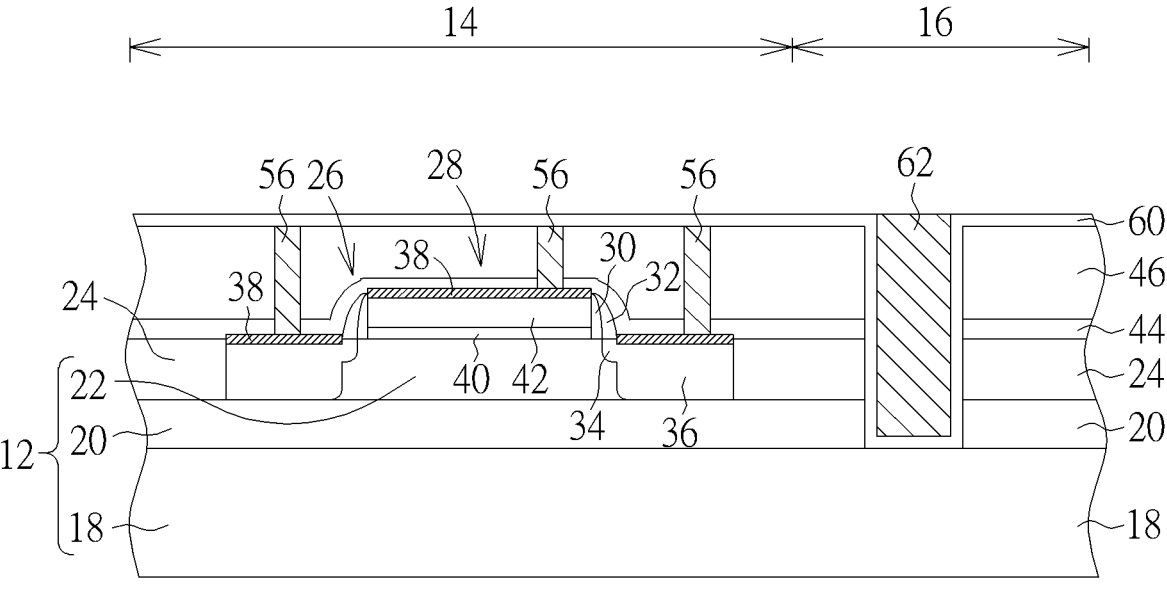
FIG. 6 illustrates a method for fabricating a semiconductor device according to a preferred embodiment of the present invention following FIG. 5.

Next, as shown in FIG. 6, a contact plug formation is conducted by forming a conductive layer (not shown) in the second contact hole 58, in which the conductive layer further includes a barrier layer (not shown) and a metal layer (not shown). Next, a planarizing process such as chemical mechanical polishing (CMP) process is conducted to remove part of the conductive layer to form a second contact plug 62 within the ILD layer 46 on second region 16. Similar to the aforementioned first contact plug 56, the barrier layer within the second contact plug 62 could be selected from the group consisting of Ti, Ta, TiN, TaN, and WN and the metal layer could be selected from the group consisting of Al, Ti, Ta, W, Nb, Mo, and Cu.

It should be noted that the planarizing process conducted at this stage to remove part of the conductive layer for forming the second contact plug 62 preferably not removing any of the liner 60 so that the top surfaces of the second contact plug 62 and the liner 60 are coplanar at this stage. Moreover, even though the bottommost surface of the second contact plug 62 is even with the bottom surface of the insulating layer 20 in this embodiment, according to another embodiment of the present invention, it would also be desirable to conduct the etching process to sequentially remove part of the ILD layer 46, part of the CESL 44, part of the STI 24, and part of the insulating layer 20 and then remove part of the first semiconductor layer 18 during the formation of the second contact hole 58 so that the bottommost surface of the second contact hole 58 is slightly lower than the bottom surface of the insulating layer 20. By doing so, the bottom surface of the second contact plug 62 formed thereafter would be slightly lower than the bottom surface of the insulating layer 20, which is also within the scope of the present invention.

Figure 7:
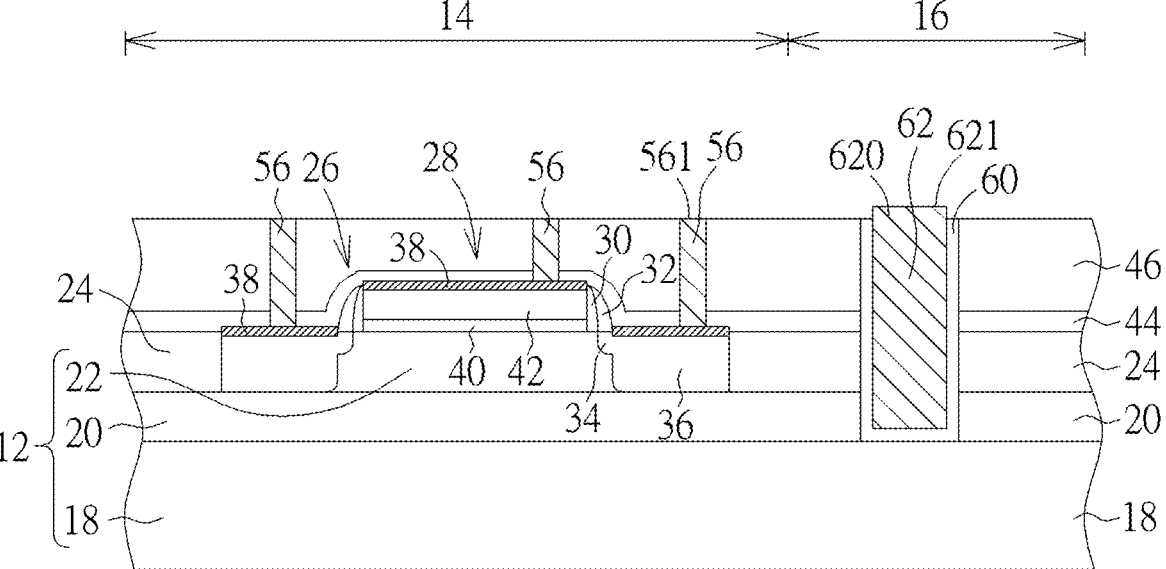
FIG. 7 illustrates a method for fabricating a semiconductor device according to a preferred embodiment of the present invention following FIG. 6.

Next, as shown in FIG. 7, an etching process could be conducted by using $C_4F_6$ as main etching gas without forming any extra mask to remove part of the liner 60 for exposing the top surface of the ILD layer 46 so that the top portion 620 of the second contact plug 62 on the second region 16 protrudes above the top surface 461 of the ILD layer 46 and has a top surface 621 higher than the top surface 461 of the ILD layer 46 while the top surface 561 of the first contact plugs 56 on the first region 14 is still even with the top surface of the ILD layer 46.

Figure 8:
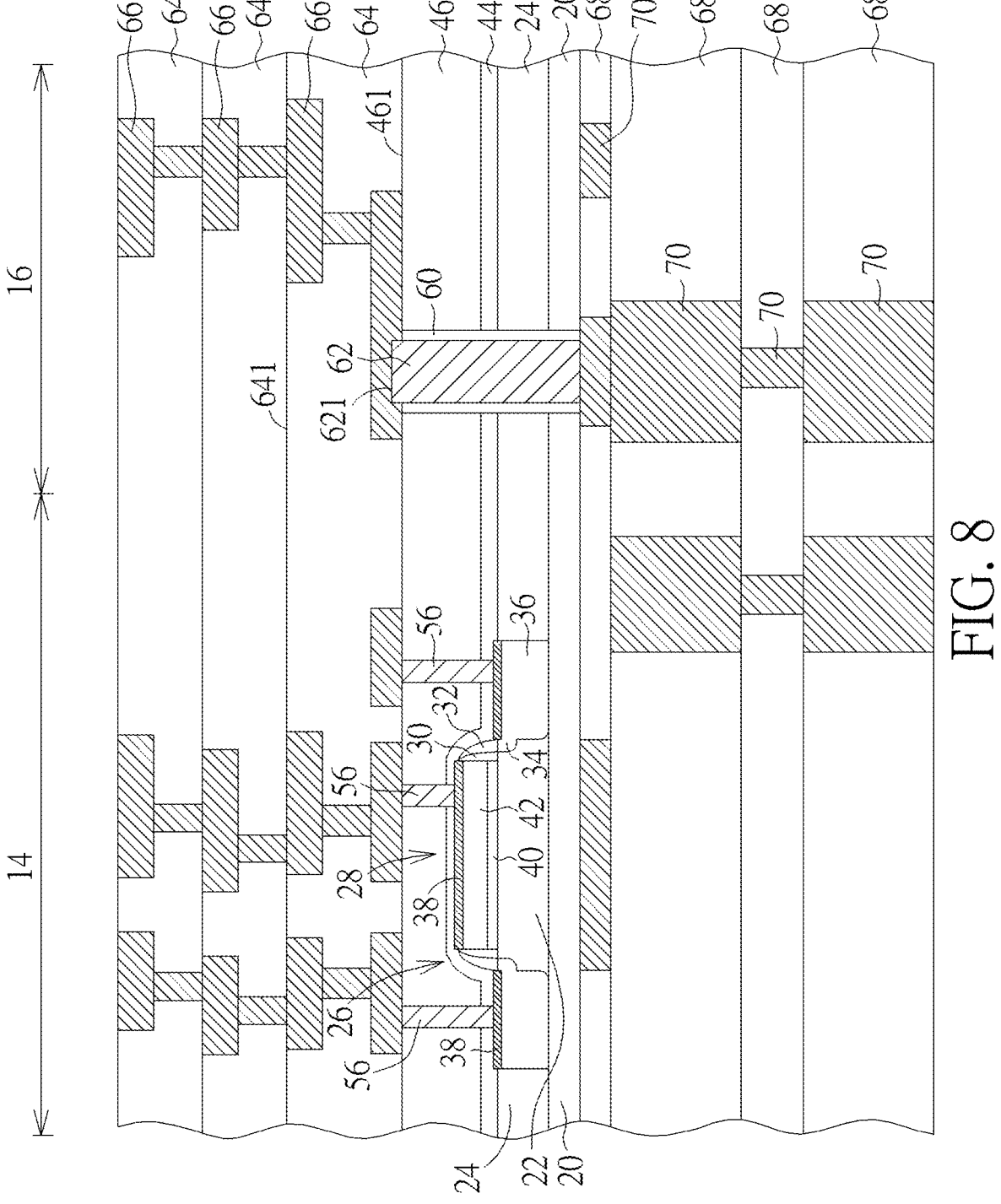
FIG. 8 illustrates a method for fabricating a semiconductor device according to a preferred embodiment of the present invention following FIG. 7.

Next, as shown in FIG. 8, follow-up process could be conducted by conducting a metal interconnective process to form one or multiple layers of inter-metal dielectric (IMD) layers 64 on the ILD layer 46, wherein the IMD layer 64 cover the top portion 620 of the second contact plug 62 so that the top surface 641 of the IMD layer 64 is higher than the top surface 621 of the second contact plug 62, and the second contact plug 62 extends from the IMD layer 64, through the ILD layer 46, to the insulating layer 20. Then metal interconnections 66 are formed in the IMD layers 64 to electrically connect the first contact plugs 56 and the second contact plug 62. Next, it would be desirable to reverse the entire semiconductor device by having the bottom or backside of the substrate 12 facing upward and remove the entire first semiconductor layer 18, part of the insulating layer 20, and part of the liner 60 so that the bottom of the second contact plug 62 is exposed. Next, another metal interconnective process could be conducted on the backside of the substrate 12 by forming one or multiple IMD layers 68 on the backside of the substrate 12 and metal interconnections 70 in the IMD layers 68 to electrically connect the second contact plug 62. This completes the fabrication of a semiconductor device according to an embodiment of the present invention.

Referring to FIG. 8, FIG. 8 illustrates a structural view of a semiconductor device according to an embodiment of the present invention. As shown in FIG. 8, the semiconductor device preferably includes an active device 26 on the substrate 12, an ILD layer 46 disposed on the active device 26, a plurality of first contact plugs 56 disposed in the ILD layer 46 and electrically connect to the active device 26, and a second contact plugs 62 disposed in the ILD layer 46 and the insulating layer 20.

In this embodiment, the active device further includes a gate structure 28 a gate structure 28 disposed on the second semiconductor layer 22 and a source/drain region 36 disposed in the second semiconductor layer 22 adjacent to two sides of the gate structure 28. The semiconductor device further includes a STI 24 around the source/drain region 36, a CESL 44 disposed on the active device 26 and the substrate 12, and a liner 60 surrounding the second contact plug 62, in which the top or topmost surface of the second contact plug 62 is higher than the topmost surface of the ILD layer 46 and the liner 60, the liner 60 contacts the CESL 44 directly, the topmost surface of the liner 60 is even with the topmost surface of the ILD layer 46, the topmost surface of the liner 60 is even with the topmost surface of the first contact plugs 56, the topmost surface of the liner 60 is slightly lower than the topmost surface of the second contact plug 62, and the width of the second contact plug 62 is greater than the width of each of the first contact plugs 56.

Figure 9:
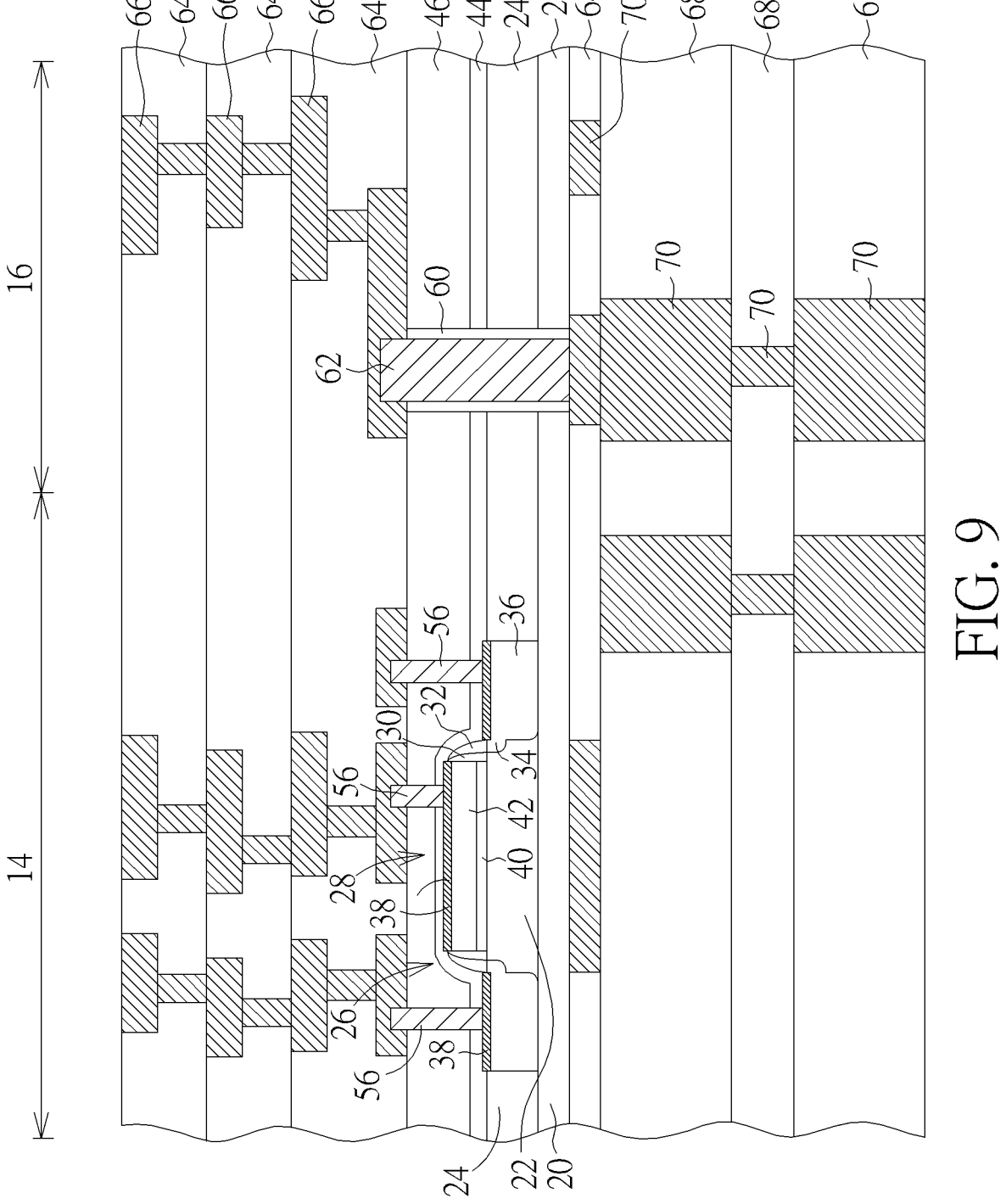
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, it would also be desirable to first conduct the etching process shown in FIG. 7 to remove the liner 60 and expose the ILD layer 46 underneath and then remove part of the ILD layer 46 as well as part of the liner 60 once more so that the first contact plugs 56 on the first region 14 also protrude from the top surface of the ILD layer 46. Overall, both the first contact plugs 56 on the first region 14 and the second contact plug 62 on the second region 16 are protruding above the top surface of the ILD layer 46 while the topmost surface of the first contact plugs 56 are slightly lower than the topmost surface of the second contact plug 62.

Overall, the present invention first forms at least an active device on the substrate, forms the aforementioned first contact plugs 56 having lesser widths on the first region 14 to electrically connect the gate structure and source/drain region of the active device, and then forms a second contact plug 62 or more specifically a backside contact having greater width on the second region 16 to connect to another wafer. By following this sequence the present invention could improve issues such as backside contact metal loss typically resulted from first fabricating the wider second contact plug (or backside contact) and then fabricating the narrower first contact plug as found in conventional art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, wherein the substrate comprises a first semiconductor layer, an insulating layer, and a second semiconductor layer;
an active device on the substrate;
an interlayer dielectric (ILD) layer on the active device;
a first contact plug in the ILD layer and electrically connected to the active device;
an inter-metal dielectric (IMD) layer on the first contact plug and the ILD layer; and
a second contact plug extending from the IMD layer, through the ILD layer, to the insulating layer, wherein a top surface of the second contact plug is higher than a top surface of the ILD layer and lower than a top surface of the IMD layer and the second contact plug has a constant width throughout.

2. The semiconductor device of claim 1, wherein the active device comprises:
a gate structure on the second semiconductor layer; and
a source/drain region adjacent to two sides of the gate structure and in the second semiconductor layer.

3. The semiconductor device of claim 2, further comprising a shallow trench isolation (STI) around the source/drain region.

4. The semiconductor device of claim 1, further comprising a contact etch stop layer (CESL) on the active device and the substrate.

5. The semiconductor device of claim 4, further comprising a liner around the second contact plug.

6. The semiconductor device of claim 5, wherein the liner contacts the CESL directly.

7. The semiconductor device of claim 5, wherein top surfaces of the liner and the ILD layer are coplanar.

8. The semiconductor device of claim 5, wherein top surfaces of the liner and the first contact plug are coplanar.

9. The semiconductor device of claim 5, wherein a top surface of the liner is lower than the top surface of the second contact plug.

10. The semiconductor device of claim 1, wherein the first contact plug has a constant width throughout, and the constant width of the second contact plug is greater than the constant width of the first contact plug.

* * * * *